(12) United States Patent
Cha et al.

(10) Patent No.: US 7,560,386 B2
(45) Date of Patent: Jul. 14, 2009

(54) METHOD OF MANUFACTURING NONVOLATILE SEMICONDUCTOR MEMORY DEVICE

(75) Inventors: Ji-hoon Cha, Seoul (KR); Woo-gwam Shim, Yongin-si (KR); Dong-gyun Han, Yongin-si (KR); Chang-ki Hong, Seongnam-si (KR); Seung-pil Chung, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/714,850

(22) Filed: Mar. 7, 2007

(65) Prior Publication Data

US 2007/0218619 A1  Sep. 20, 2007

(30) Foreign Application Priority Data

Mar. 20, 2006 (KR) .................. 10-2006-0025409

(51) Int. Cl.
*H01L 21/311* (2006.01)

(52) U.S. Cl. ............... 438/700; 438/706; 438/745; 438/954; 438/680; 257/E21.17; 257/E21.32; 257/E21.218; 257/E21.231; 257/E21.229; 257/E21.245; 257/E21.267; 257/E21.304

(58) Field of Classification Search ........... 438/700, 438/311, 201, 257, 8, 9, 680, 692, 673, 706, 438/712, 734, 723, 743, 745, 756, 684, 954
See application file for complete search history.

(56) References Cited

U.S. PATENT DOCUMENTS

| 6,620,681 | B1 * | 9/2003 | Kim et al. ........... 438/257 |
| 6,844,231 | B2 | 1/2005 | Kim et al. |
| 2003/0119259 | A1 * | 6/2003 | Jeong et al. ........ 438/257 |
| 2006/0068547 | A1 * | 3/2006 | Lee et al. ........... 438/257 |
| 2006/0088987 | A1 * | 4/2006 | Yeo et al. .......... 438/488 |

FOREIGN PATENT DOCUMENTS

| JP | 08-064700 | 3/1996 |
| JP | 2003-197784 | 7/2003 |
| KR | 10-2005-0030008 | 3/2005 |
| KR | 10-2005-0075631 | 7/2005 |
| KR | 10-2006-0000797 | 1/2006 |
| KR | 10-2006-0001308 | 1/2006 |
| KR | 10-2006-0006334 | 1/2006 |

\* cited by examiner

*Primary Examiner*—David Nhu
(74) *Attorney, Agent, or Firm*—Lee & Morse P.C.

(57) ABSTRACT

A method of manufacturing a nonvolatile semiconductor memory device may include forming a pad oxide layer pattern and a mask pattern on a semiconductor substrate, forming a trench within the semiconductor substrate with the mask pattern functioning as an etching mask, sequentially forming a first device isolation layer and a second device isolation layer that may fill the trench, forming an opening by removing the mask pattern to expose an upper surface of the pad oxide layer pattern and a sidewall of the second device isolation layer, and forming a floating gate forming region having a width wider than the opening by simultaneously removing the pad oxide layer pattern and a sidewall portion of the second device isolation layer exposed by the opening.

24 Claims, 7 Drawing Sheets

METHOD OF MANUFACTURING NONVOLATILE SEMICONDUCTOR MEMORY DEVICE

BACKGROUND OF THE INVENTION

1. Field of the Invention

The present invention relates to a method of manufacturing a semiconductor device. More particularly, the present invention relates to a method of manufacturing a nonvolatile semiconductor memory device.

2. Description of the Related Art

A semiconductor memory device is a storage device that can read stored data when required. Semiconductor memory devices may be generally classified into RAM (Random Access Memory) and ROM (Read Only Memory) devices. RAM is typically a volatile memory device, i.e., stored information is lost when power is removed, whereas ROM is typically a nonvolatile memory device, i.e., stored information is retained even when power is removed. Nonvolatile memory devices include, e.g., PROM (Programmable ROM), EPROM (Erasable PROM), EEPROM (Electrically EPROM), flash memory devices, etc.

A flash memory device may be a nonvolatile memory device in which data may not be erased even if the power supply is interrupted. A flash memory device may include a unit cell having a stacked structure of a floating gate and a control gate.

Due to the rapid progress of highly integrated nonvolatile memory devices, a method of forming a self-aligned floating gate using a device isolation layer has been widely employed to prevent misalignment of the floating gate. Typically, the method of forming the self-aligned floating gate includes forming the floating gate on active regions, which may be divided by self alignment of a device isolation layer that protrudes toward the upper portion of an exposed substrate.

Also, as the design rule decreases, the trench width of an element isolation region may decrease while the slope thereof increases. As a result, voids may occur when the device isolation layer is formed. In order to overcome this problem, an oxide layer having gap-filling characteristics has been used as a device isolation layer.

However, since the oxide layer may be chemically etched by, e.g., an etchant, during the manufacturing process of the semiconductor, it may become difficult to form the floating gate by self-alignment. In addition, since the lower width of floating gate forming regions, which may be divided by the device isolation layer to form the self-aligned floating gate, may be wider than the upper width of the floating gate forming regions, seams and voids may be generated when the floating gate is formed. For this reason, the characteristics of the semiconductor memory device may frequently deteriorate.

SUMMARY OF THE INVENTION

The present invention is therefore directed to a method of manufacturing a nonvolatile semiconductor memory device that substantially overcomes one or more of the problems due to the limitations and disadvantages of the related art.

It is therefore a feature of an embodiment of the present invention to provide a method of manufacturing a nonvolatile semiconductor memory device which may include an element isolation layer.

At least one of the above and other features and advantages of the present invention may be realized by providing a method of manufacturing a nonvolatile semiconductor memory device that may include forming a pad oxide layer pattern and a mask pattern on a semiconductor substrate, etching a trench that may be within the semiconductor substrate with the mask pattern functioning as an etching mask, sequentially forming a first device isolation layer and a second device isolation layer that may fill the trench, forming an opening by removing the mask pattern to expose an upper surface of the pad oxide layer pattern and sidewalls of the second device isolation layer, and forming a floating gate forming region having a width wider than the opening by simultaneously removing the pad oxide layer pattern and a sidewall portion of the second device isolation layer that may be exposed by the opening.

At least one of the above and other features and advantages of the present invention may be realized by providing a method of manufacturing a nonvolatile semiconductor memory device that may include forming a pad oxide layer pattern and a mask pattern on a semiconductor substrate, etching a trench that may be within the semiconductor substrate with the mask pattern functioning as an etching mask, sequentially forming a first device isolation layer and a second device isolation layer that may fill the trench, forming an opening by removing a portion of the mask pattern to expose a portion of sidewalls of the second device isolation layer, expanding a width of the opening by removing a portion exposed sidewalls of the second device isolation layer from the sidewall, exposing the upper surface of the pad oxide layer pattern by removing the mask pattern, and removing the pad oxide layer pattern to form a floating gate forming region.

BRIEF DESCRIPTION OF THE DRAWINGS

The above and other features and advantages of the present invention will become more apparent by describing in detail preferred embodiments thereof with reference to the attached drawings, in which.

DETAILED DESCRIPTION OF THE INVENTION

Figure 1A:
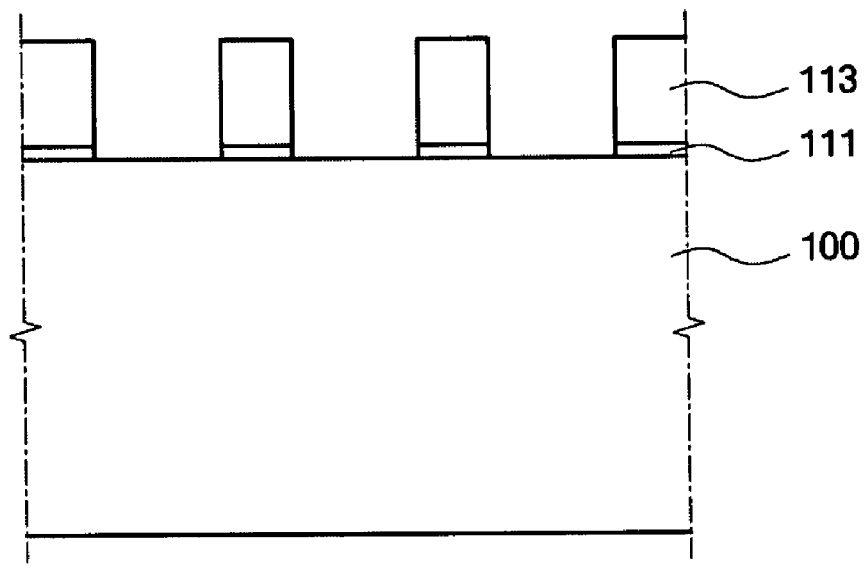
FIGS. 1A to 1H illustrate cross sectional views of stages in a method of manufacturing a nonvolatile semiconductor memory device according to an embodiment of the invention.

Korean Patent Application No. 10-2006-0025409, filed on Mar. 20, 2006, in the Korean Intellectual Property Office, and entitled: "Method of Manufacturing Nonvolatile Semiconductor Memory Device," is incorporated by reference herein in its entirety.

The present invention will now be described more fully hereinafter with reference to the accompanying drawings, in which exemplary embodiments of the invention are illustrated. The invention may, however, be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

In addition, the embodiments described in the specification will be described with reference to the cross sectional views which are the ideal illustrative view of the invention. Accordingly, the illustrative view may be changed by, for example, a manufacturing technique and/or an allowable error. Therefore, the embodiments of the invention are not limited to the shown specific form, but include the changes of the form produced in accordance with the manufacturing process. For example, an etching region shown perpendicularly may be rounded and in a form having a predetermined curvature. Accordingly, the regions illustrated in the drawings are schematic, and while the shape of the regions illustrated in the drawings may illustrate a specific form of the device region, it is not intended to limit the scope of the invention.

According to an embodiment of the present invention, it may be possible to prevent seams and voids from being formed in an element isolation layer. Furthermore, since an undercut region is prevented from being formed in a floating gate forming region, the generation of the seams and voids in the floating gate may be minimized. Accordingly, the characteristics of the nonvolatile semiconductor memory device according to the present invention may be further improved.

Hereinafter, a method of manufacturing a nonvolatile semiconductor memory device according to one embodiment of the invention will be described with reference to FIGS. 1A to 1H.

FIG. 1A illustrates a pad oxide layer pattern 111 and a mask pattern 113 that may be formed on a semiconductor substrate 100.

The substrate 100 may include a semiconductor material, e.g., one or more of Si, Ge, SiGe, GaP, GaAs, SiC, SiGeC, InAs, and InP, SOI (Silicon On Insulator), etc.

The pad oxide layer pattern 111 and the mask pattern 113 on the semiconductor substrate 100 may form an STI (Shallow Trench Isolation) type element isolation region.

The pad oxide layer pattern 111 and the mask pattern 113 may be formed using a general method (not shown) such as, e.g., forming a pad oxide layer and a mask layer on the semiconductor substrate 100, and then sequentially patterning the mask layer and the pad oxide layer by using a positive or negative photoresist pattern defining active regions as an etching mask. The mask layer and the pad oxide layer may be formed using a general method, e.g., the pad oxide layer may mainly be formed by a thermal oxidation process. The mask layer may be formed by, e.g., CVD (Chemical Vapor Deposition), SACVD (Sub-Atmospheric CVD), LPCVD (Low Pressure CVD), PECVD (Plasma Enhanced CVD), etc.

The pad oxide layer pattern 111 may be formed in order to reduce the stress between the substrate 100 and the mask pattern 113, and the pad oxide layer pattern 111 may be formed to have a thickness in the range of about 20 to 200 Å, e.g., about 50 to 150 Å. The mask pattern 113 may be formed of, e.g., a silicon nitride layer having a thickness in the range of about 500 to 2000 Å, e.g., about 1000 to 1500 Å. The mask pattern 113 may be used as a hard mask during etching to form the STI region.

Figure 1B:
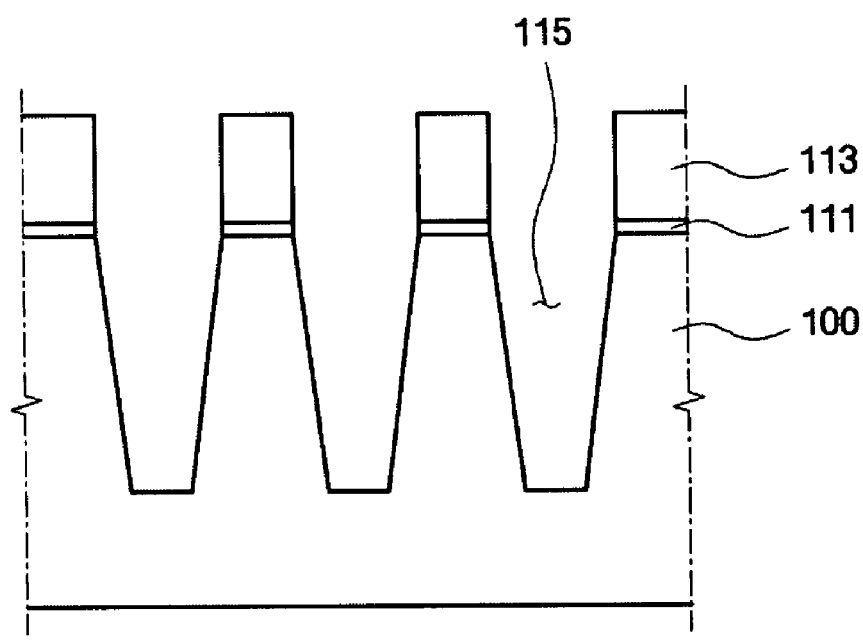

In FIG. 1B, a trench 115 for forming the STI region may be etched in the semiconductor substrate 100 by using the mask pattern 113 as the etching mask. At this time, the trench 115 may be formed by a general anisotropic dry etching process, e.g., RIE (Reactive Ion Etch). In an exemplary embodiment of the invention, the depth of the trench 115 may be about 2000 to 2500 Å from the upper surface of the semiconductor substrate 100, and the width of the upper end of the trench 115 may be formed to be about 60 nm or less.

After forming the trench 115, a conformal oxide layer (nor shown) may be formed within the trench 115 in order to repair damage caused by the etching process during the formation of the trench 115. Further, a nitride layer (not shown) having a resistance to tensile stress may also be formed on the oxide layer.

Figure 1C:
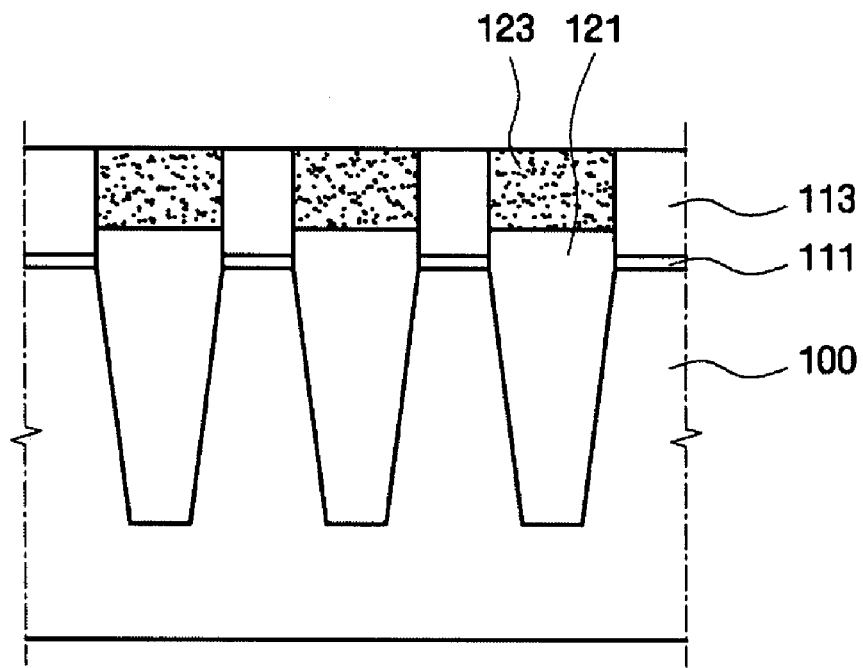

Next, referring to FIG. 1C, a first element isolation layer 121 and a second element isolation layer 123 that fill the trench 115 (refer to FIG. 1B) may be sequentially formed. Here, the first element isolation layer 121 and the second element isolation layer 123 may be formed using either a same material or different materials having excellent gap-filling characteristics.

More particularly, the first element isolation layer 121 may be disposed so that the upper surface of the first element isolation layer 121 is lower than the upper surface of the mask pattern 113 and is higher than the pad oxide pattern 111. For example, after forming the first element isolation layer 121 to have the upper surface flattened to be substantially equal to the mask pattern 113 while filling the trench 115, the first element isolation layer 121 may be formed by an additional etch back process. At this time, in order to minimize any effects on the active regions or the pad oxide layer pattern 111 while conducting the etch back process, the etch back process may be performed so that the upper surface of the first element isolation layer 121 is disposed at a higher position than the pad oxide layer. Generally, seams and voids may be formed on the element isolation layer. Therefore, if the height of the element isolation layer is lowered by removing the upper surface of the first element isolation layer 121, as described above, it may preemptively remove the region in which voids and seams may be generated.

The first element isolation layer 121 may be formed of oxide layer-based insulating materials, e.g., USG (Undoped Silica Glass), BSG (Borosilicate Glass), or PSZ (Polysilazane), etc., and may be formed by a common deposition process, e.g., CVD, SACVD, LPCVD, PECVD, ALD, etc.

Next, the second element isolation layer 123 may be formed on the first element isolation layer 121. Like the first element isolation layer 121, the second element isolation layer 123 may be formed by conventional deposition process, e.g., CVD, SACVD, LPCVD, PECVD, ALD, etc. The second element isolation layer 123 may prevent the first element isolation layer 121 from being damaged by various chemicals in a subsequent process, and may prevent seams and voids from occurring in the first element isolation layer 121.

As described above, the second element isolation layer 123 may be formed of material which is similar to or different to the first element isolation layer 121. For example, a layer formed by, e.g., USG, BSG, PSZ, or HDP (High Density Plasma) oxide, etc. may be used as the second element isolation layer 123. The second element isolation layer 123 may be more compact than the first element isolation layer 121. Accordingly, the second element isolation layer 123 may protect the first element isolation layer 121 with respect to various process chemicals or environmental moisture. In addition, the second element isolation layer 123 may be formed of material having excellent gap-filling characteristics, e.g., an HDP oxide.

FIG. 1C illustrates that the upper surface of the second element isolation layer 123 may be flattened to a level substantially equal to the mask pattern 113. The flattening may be performed by, e.g., a CMP (Chemical Mechanical Polishing) process or an etch-back process. The mask pattern 113 may be used as a flattening stop layer in the flattening process. For example, when flattening an HDP oxide layer 123 by CMP, the mask pattern 113 may function as a stopper. Slurry may be used in the CMP process that etches the second element isolation layer 123 at a faster rate than the mask pattern 113.

By forming a double layer structure of the element isolation layer 121, 123 using material having excellent gap-filling characteristics within the trench 115, seams and voids may be prevented from forming in the element isolation layer structure 121,123. In addition, since the second element isolation layer 123 may inhibit damage of the first isolation layer 121, the characteristics of the element isolation layer structure 121,123 may be improved.

Figure 1D:
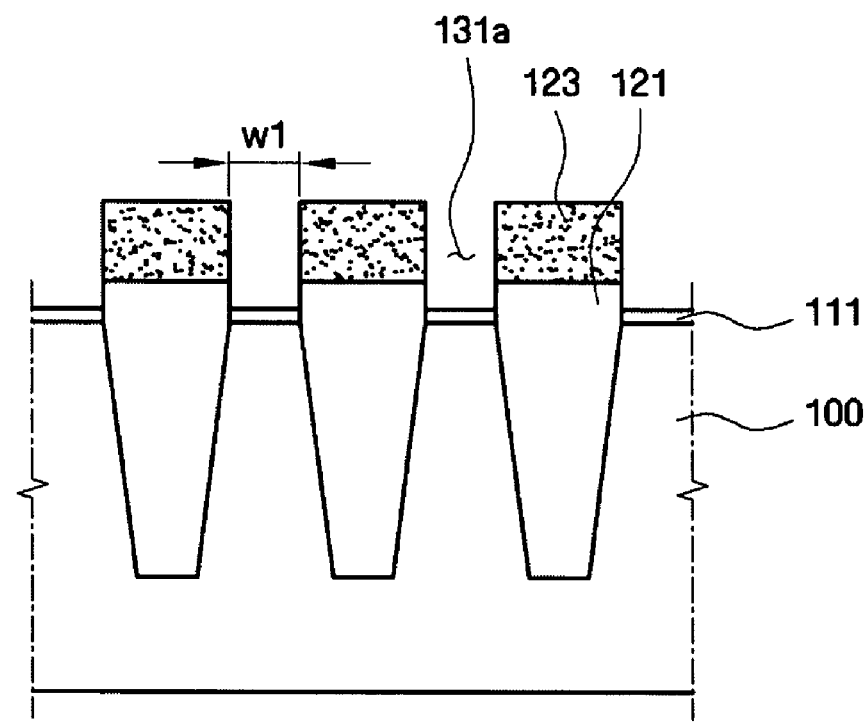

Next, referring to FIG. 1D, the mask pattern 113 may be removed. In an implementation, the mask pattern 113 may be entirely removed. Removing the mask pattern 113 may be performed by isotropic etching. For example, when the mask pattern 113 is a nitride layer, a wet etch using, e.g., phosphoric acid solution, or a dry etch using, e.g., CDE (Chemical Dry Etching), may be used. Alternately, a remote plasma method may be used.

A remote plasma dry etching method may generate plasma for dry etching outside of the reaction chamber, and then may introduce the plasma into the chamber. Furthermore, the CDE method may use, e.g., $CF_4$, HF, $CH_2F_2$, $H_2O$, $CH_3OH$, or a combination thereof as the etching gas, and also use a controller gas, e.g., $O_2$ or $N_2$. In this case, a high etching selectivity ratio with respect to the nitride layer may be obtained at, e.g., about 10 to 70° C. and about 75 to 675 mTorr.

By removing the mask pattern 113 as described above, the upper surface of the pad oxide layer pattern 111 and the sidewall of the second element isolation layer 123 may be exposed, and an opening 131a having a width of w1 may be formed. The sidewall of the first element isolation layer 121 located at the lower surface of the second element isolation layer 123 may be partially exposed.

Figure 1E:
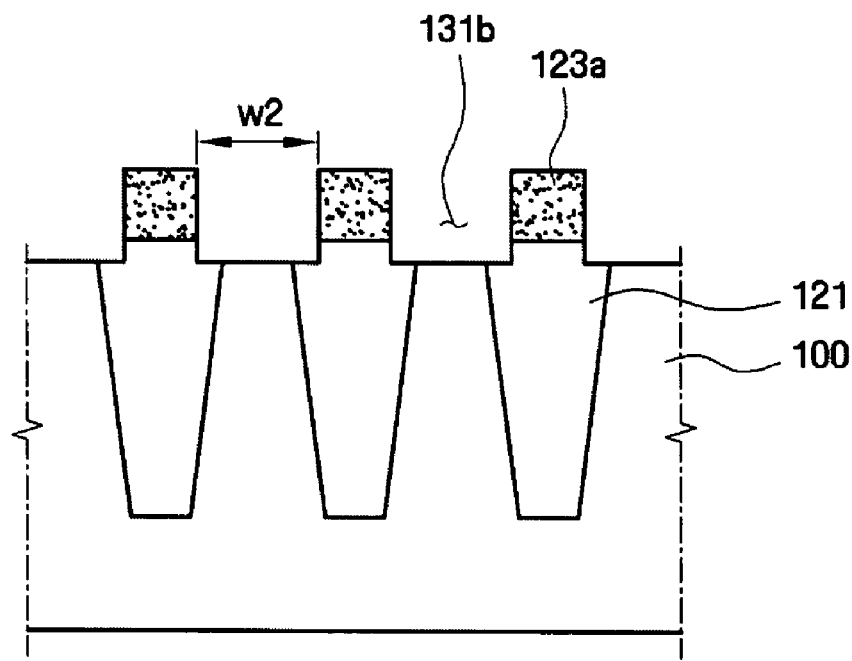

Next, as shown in FIG. 1E, a floating gate forming region 131b may be formed by removing the pad oxide layer pattern 111. The process of removing the pad oxide layer pattern 111 (see FIG. 1D) may be performed by an etching method having a similar etching selectivity ratio with respect to the first element isolation layer 121 and the second element isolation layer 123, as well as to the pad oxide layer pattern 111. The etching method may be, e.g., plasma dry etching. A remote plasma dry etching method may be used because damage to the semiconductor substrate 100 may be reduced or minimized.

If the pad oxide layer pattern 111 (see FIG. 1D) is removed by a general wet etching by using, e.g., a solution containing hydrofluoric acid (HF), the exposed region of the first element isolation layer 121, which may be made of material that readily chemically reacts, may be removed together with the pad oxide layer pattern 111 during the removal of the pad oxide layer pattern. Additionally, the second element isolation layer 123 may be less etched than the first element isolation layer 121. Therefore, a recess may form in the exposed sidewall of the first element isolation layer 121, thus forming an undercut region at the lower surface of the second element isolation layer 123. The undercut region may act as a factor in which the seams and voids form while manufacturing the floating gate.

On the other hand, according to an embodiment of the present invention, since the pad oxide layer pattern 111 may be removed by, e.g., a plasma dry etching method having a similar etching selectivity ratio with respect to most oxide layers, the magnitude of the etch of the first element isolation layer 121 may be similar, i.e., substantially the same, to that of the second element isolation layer 123 during the removal of the pad oxide layer pattern 111. Accordingly, the formation of the undercut region, which may be generated conventionally, may be prevented.

According to an embodiment of the present invention, the remote plasma dry etching method may include, e.g., mixing $NF_3$, which may cause the generation of a small amount of polymer, along with $H_2$, $N_2$ etc. For example, the process may include mixing, e.g., $NF_3$ in a range of about 10 to 200 sccm, $H_2$ in a range of about 10 to 50 sccm, and $N_2$ in a range of about 10 to 4000 sccm. Specifically, $H_2$ and $N_2$ may attain a plasma state outside the reaction chamber before being introduced into the reaction chamber, and $NF_3$ gas may be introduced into the chamber. The $NF_3$ gas may react with the $H_2$ and $N_2$ plasmas inside the reactant chamber, and thus may become the main etchant capable of etching the oxide layer. Here, the etching of the oxide layer may be conducted at, e.g., a chamber pressure of about 1 to 20 torr, a bias power of about 50 to 1000 W, and a processing temperature of about 5 to 50° C. Next, an annealing process may be conducted at about 100 to 200° C., and thus may vaporize the resultant, i.e., byproducts, produced by the reaction of the oxide layer and the main etchant. Therefore, the resultant may be removed.

By the etching process, the pad oxide layer pattern 111 (refer to FIG. 1D), and the second element isolation layer 123 exposed by the opening 131a may be partially removed from the sidewall. As a result, the width w1 of the opening shown in FIG. 1D may expand, and the floating gate forming region 131b having a width of w2 may be formed. In addition, a portion of the first element isolation layer 121 adjacent to the pad oxide layer pattern 111 (refer to FIG. 1D) may be simultaneously removed with the pad oxide layer pattern 111. Therefore, the sidewall profile of the floating gate forming region 131b may be aligned with the sidewall profile of the second element isolation layer 123a.

Figure 1F:
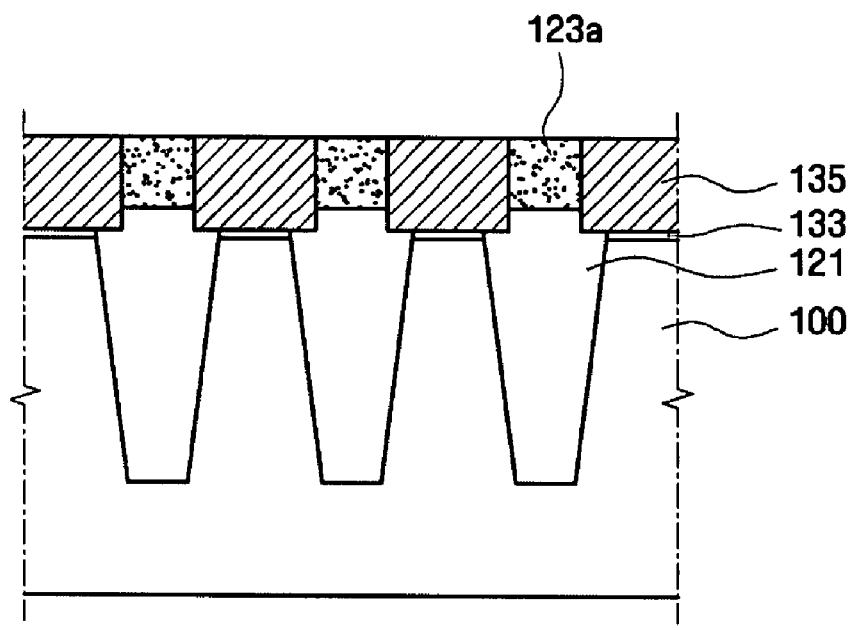

Next, as illustrated in FIG. 1F, a tunnel insulating layer 133 may be formed on the active region of the floating gate forming region 131b, and a floating gate 135 may be formed by filling the floating gate forming region 131b with a conductive substance.

The tunnel insulating layer 133 may be, e.g., a silicon oxide layer, and may be formed by e.g., thermal oxidation or a deposition process. The deposition process may be, e.g., CVD. In addition, floating gates 135 may be separated from each other by the second element isolation layer 123, and the upper surfaces of the floating gates 135 may be formed to be substantially equal to the upper surface of the second element isolation layer 123a. Here, the conductive substance may be, e.g., polysilicon in which impurities may be doped.

Figure 1G:
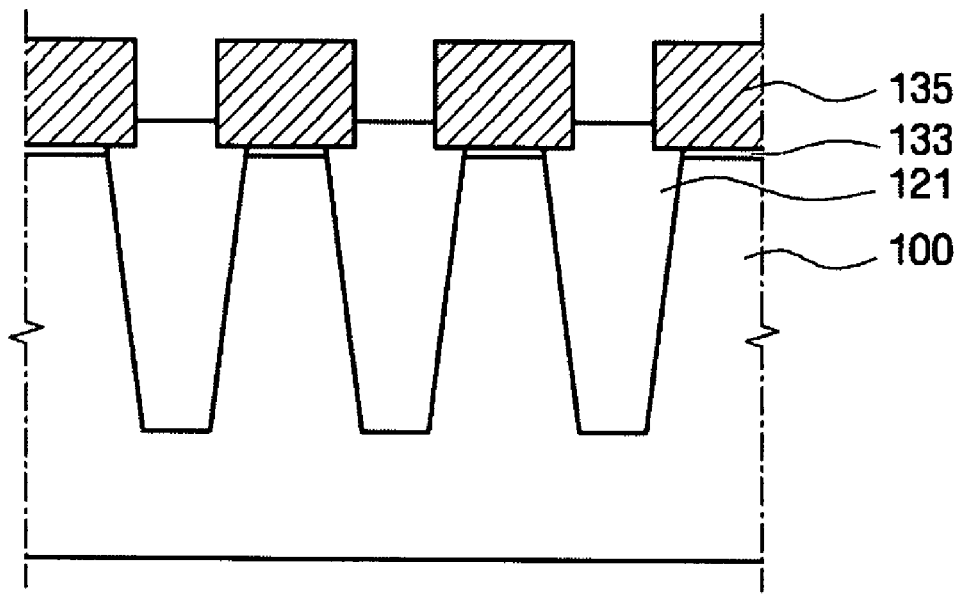

In FIG. 1G, the second element isolation layer 123a may be removed to expose the sidewalls of the floating gates 135. The process for removing the second element isolation layer 123a, which may be, e.g., an HDP oxide layer, may include an isotropic etching method, e.g., wet etching using hydrofluoric acid, or dry etching. Alternatively, the process may be performed by wet etching and dry etching. During the process for removing the second element isolation layer 123a, a surface portion of the underlying first element isolation layer 121 may also be removed.

Figure 1H:
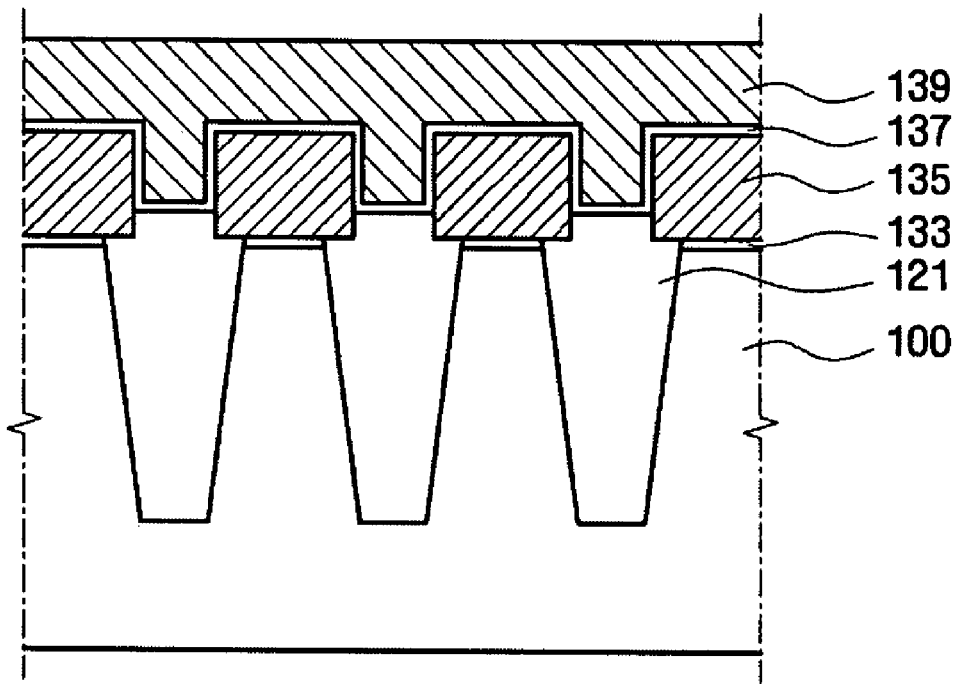

Referring to FIG. 1H, an inter-gate dielectric layer 137 and a control gate 139 may be formed. The inter-gate dielectric layer 137 may conform to, i.e., coat, the sidewall and the upper surface of the floating gate 135, and the upper surface of the first element isolation layer 121 exposed by the removal of the second element isolation layer 123a. The inter-gate dielectric layer 137 may be formed of, e.g., an ONO (Oxide Nitride Oxide) layer. The control gate 139 may be formed on the inter-gate dielectric layer 137. Here, the control gate 139 may be, e.g., a polysilicon layer in which impurities are doped, a metal silicide layer, or a composite layer thereof. The impurities doped into the polysilicon layer may be n or p impurities, e.g., As or B.

Next, the nonvolatile semiconductor memory device may be completed in accordance with related art of nonvolatile semiconductor memory device technology.

Hereafter, stages in a method of manufacturing a nonvolatile semiconductor memory device according to another embodiment of the invention will be described with reference to FIGS. 2A to 2G. The description of process stages substantially equivalent to those illustrated in FIGS. 1A to 1H will be omitted or briefly described to avoid repetition.

Figure 2A:
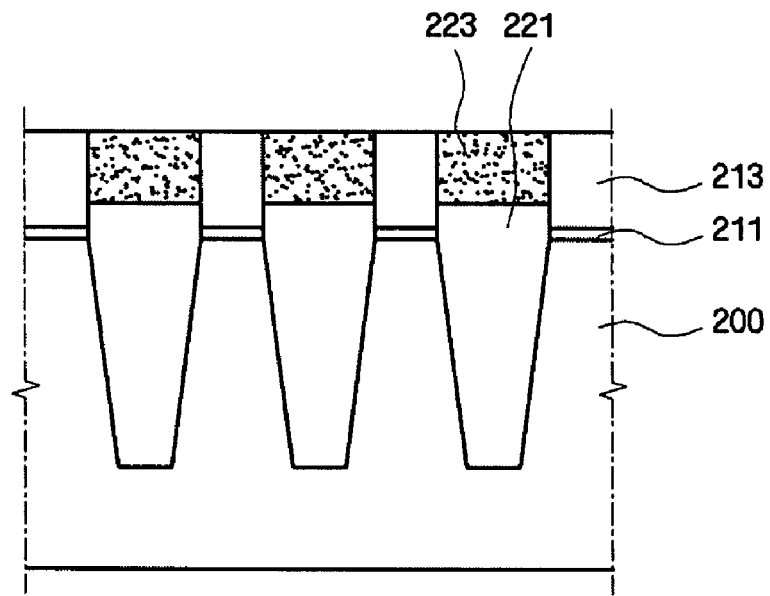
FIGS. 2A to 2F illustrate cross sectional views of stages in a method of manufacturing a nonvolatile semiconductor memory device according to another embodiment of the invention.

Referring to FIG. 2A, and with reference to FIGS. 1A and 1B, a pad oxide layer pattern 211 and a mask pattern 213 may be on a semiconductor substrate 200, and a trench may be formed in the semiconductor substrate by using the mask pattern 213 as an etching mask. Then, a first element isolation layer 221 and a second element isolation layer 223 filling the trench may be sequentially formed.

Figure 2B:
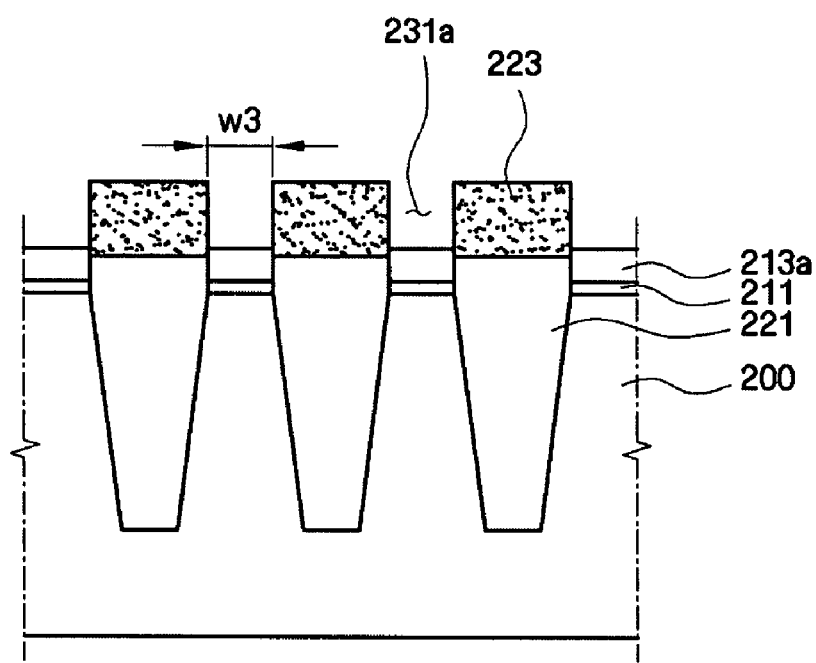

In FIG. 2B, an opening 231a may be formed by removing a portion of the mask pattern 213 to expose the sidewall of the second element isolation layer 223. Here, the width of the opening 231a is indicated as w3.

The process of removing a portion of the mask pattern 213 may be performed by isotropic etching. When the mask pattern 213 is, e.g., a nitride layer, wet etching using, e.g., phosphoric acid solution or dry etching using, e.g., CDE (Chemical Dry Etching) may be performed. In addition, the magnitude of the etch may be appropriately adjusted by, e.g., controlling the etching time.

The etching amount of the mask pattern 213 may be adjusted to sufficiently expose the sidewall of the second element isolation layer 223, but the etching may be limited to not expose the first element isolation layer 221 and the pad oxide layer pattern 211. Also, a remnant of the mask pattern 213a may remain after partial removal of the mask pattern 213.

Figure 2C:
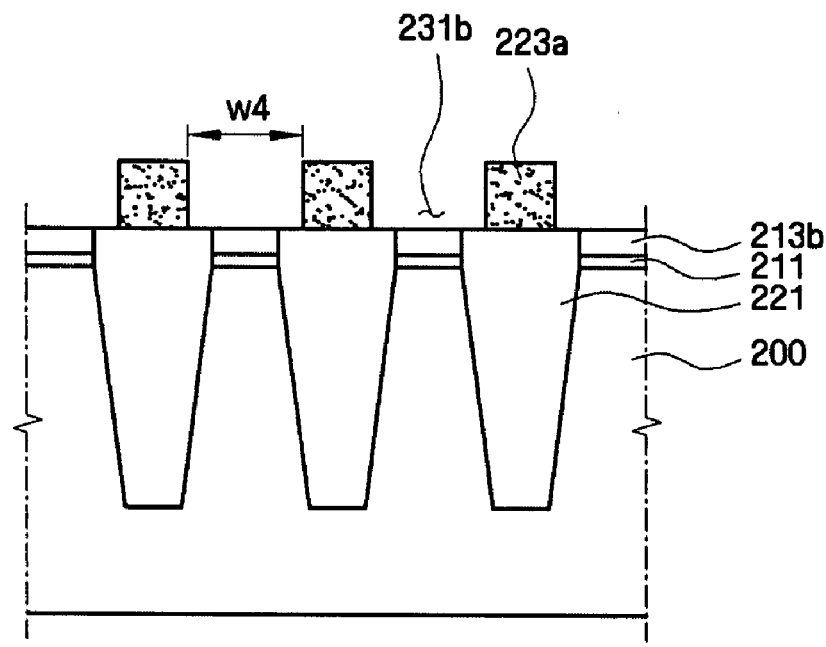

In FIG. 2C, a portion of the second element isolation layer 223 may be removed from the sidewall thereof to expand the width w3 of the previously formed opening 231a so as to yield an expanded opening 231b of width w4. At this time, a portion of the second element isolation layer 223 may be removed by isotropic etching, e.g., wet etching using a hydrofluoric acid solution, or by dry etching.

If the first element isolation layer 221 is exposed before the portion of the second element isolation layer 223 is removed, a portion of the first element isolation layer 221, together with the portion of the second element isolation layer 223, may be removed. Accordingly, a recessed region or an undercut may form. Due to the undercut, voids and seams may be generated during the formation of a floating gate during the subsequent processing. However, according to an embodiment of the invention, since the pad oxide layer pattern 211 and the first element isolation layer 221 are not exposed during the process described with reference to FIG. 2B, it may be possible to prevent the above-mentioned undercut.

Figure 2D:
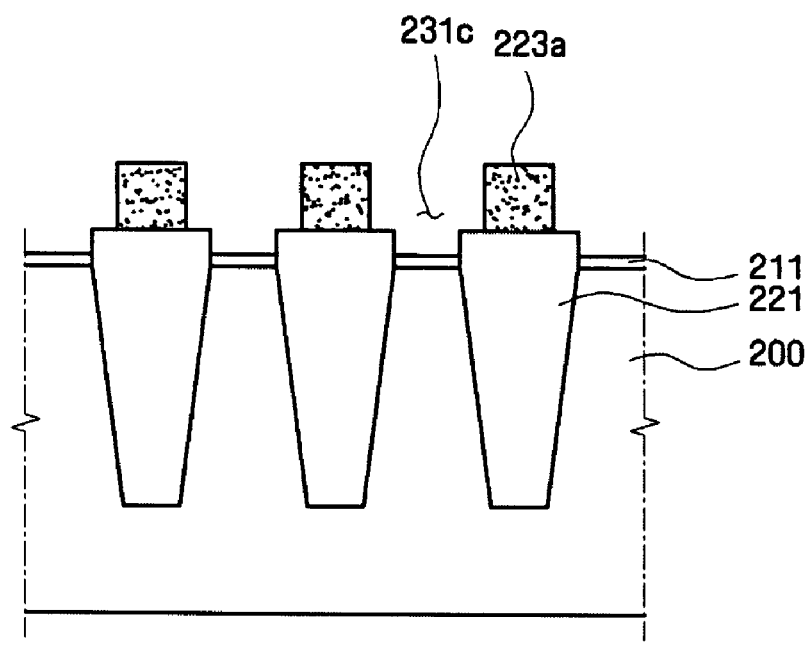

Next, as illustrated in FIG. 2D, the remnant of the mask pattern 213b in the expanded opening 231b may be removed to expose the pad oxide layer pattern 211. Removing the mask pattern 213b may be performed by, e.g., isotropic etching. For example, when the mask pattern 213 is a nitride layer, wet etching using, e.g., phosphoric acid solution, or dry etching, e.g., CDE (Chemical Dry Etching), may be utilized.

By the above-mentioned processes, a portion of the first element isolation layer 221 thereto as well as the pad oxide layer pattern 211 may be exposed.

Figure 2E:
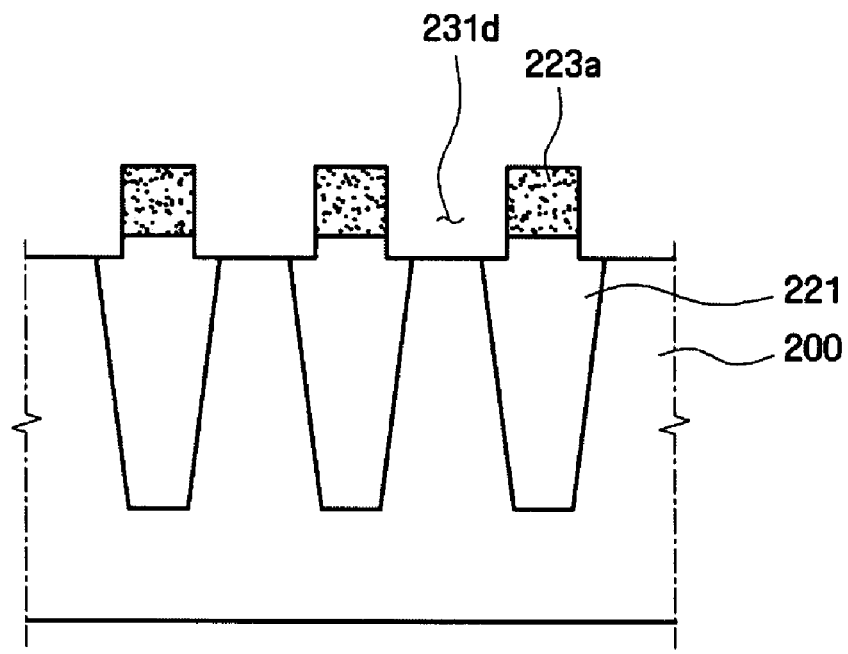

Next, as illustrated in FIG. 2E, a floating gate forming region 231d may be completed by removing the pad oxide layer pattern 211. At this time, a portion of the first element isolation layer 221 adjacent to the pad oxide layer pattern 211 and the pad oxide layer pattern 211 may be simultaneously or sequentially removed. In this case, the sidewall profile of the completed floating gate forming region 231d may be aligned with the sidewall profile of the opening 231c (see FIG. 2D). In addition, since a portion of the second element isolation layer 223a may also be partially etched during the removal of the pad oxide layer pattern 211, the width of the opening 231d may be further expanded.

Figure 2F:
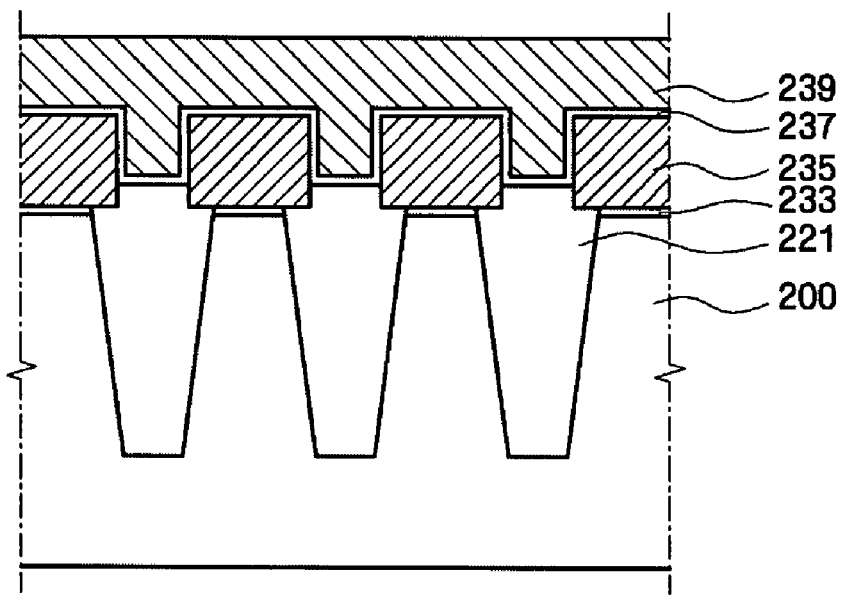

Next, referring to FIG. 2F, a tunnel insulating layer 233 may be formed on the active region of the floating gate forming region 231d, and a floating gate 235 may be formed by filling the opening 231d with a conductive substance, as was similarly described above with reference to FIGS. 1F to 1H.

Next (not shown), the second element isolation layer 223a may be removed. The sidewall of the floating gate 235 may thus be exposed. Next (not shown), the second element isolation layer 223a may be removed. The sidewall of the floating gate 235 may thus be exposed. Afterwards, an inter-gate dielectric layer 237 may be formed to conform to, i.e., coat, the sidewall and the upper surface of the floating gate 235. At this time, the inter-gate dielectric layer 237 may be also be formed on the exposed upper surface of the first element isolation layer 221. The inter-gate dielectric layer 237 may be formed of, e.g., an ONO (Oxide Nitride Oxide).

Then, a control gate 239 may be formed on the inter-gate dielectric layer 237. Here, the control gate 239 may use, e.g., a polysilicon layer in which impurities are doped, a metal silicide layer, or a composite layer thereof.

As described above, the nonvolatile semiconductor memory device according to the present invention may form an element isolation layer and a floating gate in which the generation of seams and voids are minimized. Therefore, the characteristics of the nonvolatile semiconductor memory device manufactured according to the present invention may be further improved.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of manufacturing a nonvolatile semiconductor memory device, comprising:

forming a pad oxide layer pattern and a mask pattern on a semiconductor substrate;

etching a trench in the semiconductor substrate with the mask pattern functioning as an etching mask; and sequentially forming a first device isolation layer and a second device isolation layer filling the trench including, forming the first device isolation layer by filling the trench to have an upper surface of the first device isolation layer lower than an upper surface of the mask pattern and higher than the upper surface of the pad oxide layer pattern, and forming the second device isolation layer on the first device isolation layer such that the second device isolation layer has an upper surface equal to the mask pattern.

2. The method of manufacturing a nonvolatile semiconductor memory device according to claim 1, further comprising:
forming an opening by removing the mask pattern to expose an upper surface of the pad oxide layer pattern and sidewalls of the second device isolation layer; and
forming a floating gate forming region having a width wider than the opening by simultaneously removing the pad oxide layer pattern and a sidewall portion of the second device isolation layer exposed by the opening.

3. The method of manufacturing a nonvolatile semiconductor memory device according to claim 2, wherein forming the floating gate forming region further comprises simultaneously removing a portion of the first device isolation layer adjacent to the pad oxide layer pattern such that sidewalls of the first and second device isolation layers are aligned.

4. The method of manufacturing a nonvolatile semiconductor memory device according to claim 2, wherein the removing of the mask pattern includes isotropic etching.

5. The method of manufacturing a nonvolatile semiconductor memory device according to claim 2, wherein the removing the pad oxide layer pattern and a portion of the second device isolation layer includes plasma dry etching having a similar etch ratio with respect to the pad oxide layer pattern and the portion of the second device isolation layer.

6. The method of manufacturing a nonvolatile semiconductor memory device according to claim 5, wherein the plasma dry etching is remote plasma dry etching.

7. The method of manufacturing a nonvolatile semiconductor memory device according to claim 6, wherein the remote plasma dry etching comprises introducing $H_2$ and $N_2$ plasmas and $NF_3$ gas into a processing chamber.

8. The method of manufacturing a nonvolatile semiconductor memory device according to claim 6, wherein the remote plasma dry etching is performed in $NF_3$ in a range of about 10 sccm to 200 sccm, $H_2$ in a range of about 10 sccm to 50 sccm, and $N_2$ in a range of about 10 sccm to 4000 sccm.

9. The method of manufacturing a nonvolatile semiconductor memory device according to claim 2, further comprising:
forming a floating gate filling the floating gate forming region;
exposing sidewalls of the floating gate by removing the second device isolation layer; and
forming a dielectric layer and a control gate on the floating gate and on the first device isolation layer.

10. The method of manufacturing a nonvolatile semiconductor memory device according to claim 2, wherein the first device isolation layer includes at least one of undoped silica glass, borosilicate glass, or polysilazane.

11. The method of manufacturing a nonvolatile semiconductor memory device according to claim 2, wherein the second device isolation layer includes at least one of undoped silica glass, borosilicate glass, polysilazane, or high density plasma oxide.

12. The method of manufacturing a nonvolatile semiconductor memory device according to claim 1, further comprising:
forming an opening by removing a portion of the mask pattern to expose a portion of sidewalls of the second device isolation layer;
expanding a width of the opening by removing a portion of the exposed sidewalls of the second device isolation layer;
exposing an upper surface of the pad oxide layer pattern by removing the mask pattern; and
removing the pad oxide layer pattern to form a floating gate forming region.

13. The method of manufacturing a nonvolatile semiconductor memory device according to claim 12, wherein forming the floating gate forming region further comprises simultaneously removing a portion of the first device isolation layer adjacent to the pad oxide layer pattern such that sidewalls of the first and second device isolation layers are aligned.

14. The method of manufacturing a nonvolatile semiconductor memory device according to claim 12, wherein the removing the mask pattern includes isotropic etching.

15. The method of manufacturing a nonvolatile semiconductor memory device according to claim 12, wherein the removing of the portion of the exposed sidewall of the second device isolation layer includes isotropic etching.

16. The method of manufacturing a nonvolatile semiconductor memory device according to claim 12, wherein the sequential forming of the first device isolation layer and the second device isolation layer comprises:
forming the first device isolation layer by filling the trench to have an upper surface the first device isolation layer lower than an upper surface of the mask pattern and higher than the upper surface of the pad oxide layer pattern; and
forming the second device isolation layer on the first device isolation layer such that the second device isolation layer has an upper surface equal to the mask pattern.

17. The method of manufacturing a nonvolatile semiconductor memory device according to claim 12, wherein the first device isolation layer includes at least one of undoped silica glass, borosilicate glass, or polysilazane.

18. The method of manufacturing a nonvolatile semiconductor memory device according to claim 12, wherein the second device isolation layer includes at least one of undoped silica glass, borosilicate glass, polysilazane or high density plasma oxide.

19. The method of manufacturing a nonvolatile semiconductor memory device according to claim 12, wherein the removing of the pad oxide layer includes remote plasma dry etching.

20. A method of manufacturing a nonvolatile semiconductor memory device, comprising:
forming a pad oxide layer pattern and a mask pattern on a semiconductor substrate;
etching a trench in the semiconductor substrate with the mask pattern functioning as an etching mask;
sequentially forming a first device isolation layer and a second device isolation layer filling the trench;
forming an opening by removing the mask pattern to expose an upper surface of the pad oxide layer pattern, sidewalls of the second device isolation layer, and upper sidewalls of the first device isolation layer; and
forming a floating gate forming region having a width wider than the opening by simultaneously removing the pad oxide layer pattern, a sidewall portion of the second device isolation layer exposed by the opening, and an upper sidewall portion of the first device isolation layer.

21. The method of manufacturing a nonvolatile semiconductor memory device according to claim 20, wherein removing the mask pattern includes plasma dry etching, the plasma dry etching being a remote plasma dry etching.

22. A method of manufacturing a nonvolatile semiconductor memory device, comprising:
forming a pad oxide layer pattern and a mask pattern on a semiconductor substrate;

etching a trench in the semiconductor substrate with the mask pattern functioning as an etching mask;

sequentially forming a first device isolation layer and a second device isolation layer filling the trench;

forming an opening by removing the mask pattern via dry etching to expose an upper surface of the pad oxide layer pattern, sidewalls of the second device isolation layer, and upper sidewalls of the first device isolation layer;

forming a floating gate forming region having a width wider than the opening by simultaneously removing the pad oxide layer pattern, a sidewall portion of the second device isolation layer exposed by the opening, and an upper sidewall portion of the first device isolation layer, wherein the dry etching is a remote plasma dry etching introducing $H_2$ and $N_2$ plasmas and $NF_3$ gas into a processing chamber.

23. The method of manufacturing a nonvolatile semiconductor memory device according to claim 22, wherein the remote plasma dry etching is performed in $NF_3$ in a range of about 10 sccm to 200 sccm, $H_2$ in a range of about 10 sccm to 50 sccm, and $N_2$ in a range of about 10 sccm to 4000 sccm.

24. A method of manufacturing a nonvolatile semiconductor memory device, comprising:

forming a pad oxide layer pattern and a mask pattern on a semiconductor substrate;

etching a trench in the semiconductor substrate with the mask pattern functioning as an etching mask;

sequentially forming a first device isolation layer and a second device isolation layer filling the trench;

forming an opening by removing the mask pattern to expose an upper surface of the pad oxide layer pattern, sidewalls of the second device isolation layer, and upper sidewalls of the first device isolation layer;

forming a floating gate forming region having a width wider than the opening by simultaneously removing the pad oxide layer pattern, a sidewall portion of the second device isolation layer exposed by the opening, and an upper sidewall portion of the first device isolation layer, wherein sequentially forming the first device isolation layer and the second device isolation layer comprises:

forming the first device isolation layer by filling the trench to have an upper surface of the first device isolation layer lower than an upper surface of the mask pattern and higher than the upper surface of the pad oxide layer pattern; and forming the second device isolation layer on the first device isolation layer such that the second device isolation layer has an upper surface equal to the mask pattern.

* * * * *